US 11,264,898 B2

(12) United States Patent
Zhang et al.

(10) Patent No.: US 11,264,898 B2
(45) Date of Patent: Mar. 1, 2022

(54) SWITCHING CONVERTER WITH MULTIPLE DRIVE STAGES AND RELATED MODES

(71) Applicant: TEXAS INSTRUMENTS INCORPORATED, Dallas, TX (US)

(72) Inventors: Liang Zhang, Beijing (CN); Weibing Jing, Beijing (CN); Dan Li, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/690,830

(22) Filed: Nov. 21, 2019

(65) Prior Publication Data

US 2020/0403509 A1 Dec. 24, 2020

Related U.S. Application Data

(63) Continuation of application No. PCT/CN2019/092512, filed on Jun. 24, 2019.

(51) Int. Cl.
| | |
|---|---|
| *H02M 3/158* | (2006.01) |
| *H02M 1/08* | (2006.01) |
| *H02M 1/32* | (2007.01) |

(52) U.S. Cl.
CPC ............. *H02M 3/158* (2013.01); *H02M 1/08* (2013.01); *H02M 1/32* (2013.01)

(58) Field of Classification Search
CPC ................... H02M 3/158; H02M 1/08; H02M 2001/0022; H02M 1/088; H02M 1/32
See application file for complete search history.

(56) References Cited

U.S. PATENT DOCUMENTS

| 6,130,563 | A | * | 10/2000 | Pilling | H03K 17/164 |
| | | | | | 327/111 |
| 7,982,445 | B1 | * | 7/2011 | Xin-LeBlanc | H02M 3/158 |
| | | | | | 323/282 |
| 9,660,528 | B2 | * | 5/2017 | Xie | H02M 3/158 |
| 10,256,812 | B2 | * | 4/2019 | Leong | H03K 17/6871 |

(Continued)

FOREIGN PATENT DOCUMENTS

| CN | 107005157 A | 8/2017 |
| GB | 2537691 A | 10/2016 |

OTHER PUBLICATIONS

PCt Search Report for Application No. PCT/CN2019/092512, dated Apr. 1, 2020.
English Translation—CN107005157A.

*Primary Examiner* — Gustavo A Rosario-Benitez
(74) *Attorney, Agent, or Firm* — Mark Allen Valetti; Charles A. Brill; Frank D. Cimino (57) ABSTRACT

A system includes a switching converter with an output inductor. The switching converter also includes a switch set with a switch node coupled to the output inductor. The switching converter also includes a first drive stage coupled to the switch set. The switching converter also includes a second drive stage coupled to the switch set. The switching converter also includes a controller coupled to the first drive stage and the second drive stage. The controller includes a supply voltage detector circuit. The controller also includes a level shifter coupled to an output of the supply voltage detector circuit. The controller also includes a selection circuit coupled between the level shifter and the second drive stage.

13 Claims, 6 Drawing Sheets

(56) References Cited

U.S. PATENT DOCUMENTS

| | | | |
|---|---|---|---|
| 10,637,348 B1* | 4/2020 | Wu | H03K 17/04206 |
| 10,819,212 B1* | 10/2020 | Nagano | H02M 1/08 |
| 2008/0278128 A1* | 11/2008 | Nagase | H02M 3/158 |
| | | | 323/282 |
| 2011/0037509 A1* | 2/2011 | Herzer | H03K 19/018521 |
| | | | 327/333 |
| 2012/0062190 A1* | 3/2012 | Haiplik | H02M 3/156 |
| | | | 323/271 |
| 2012/0182049 A1* | 7/2012 | Garbossa | H02M 3/155 |
| | | | 327/109 |
| 2013/0265029 A1* | 10/2013 | Akiyama | H03K 17/162 |
| | | | 323/311 |
| 2016/0087518 A1* | 3/2016 | Agarwal | H02M 1/00 |
| | | | 323/271 |
| 2016/0164500 A1* | 6/2016 | Nene | H03K 3/017 |
| | | | 327/175 |
| 2017/0302151 A1* | 10/2017 | Snook | H03K 17/063 |
| 2018/0145675 A1* | 5/2018 | Suh | H02H 7/222 |
| 2018/0241389 A1* | 8/2018 | Nakashima | H03K 17/7955 |
| 2018/0294709 A1* | 10/2018 | Araki | H03K 17/16 |
| 2019/0013731 A1 | 1/2019 | Gritti | |
| 2019/0140635 A1* | 5/2019 | Abesingha | H02M 1/38 |
| 2019/0173465 A1* | 6/2019 | Brown | H02M 1/08 |
| 2020/0099285 A1* | 3/2020 | Sugawara | H02M 1/08 |

\* cited by examiner

SWITCHING CONVERTER WITH MULTIPLE DRIVE STAGES AND RELATED MODES

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage(s), the output voltage(s), efficiency, reliability, size and/or other characteristics. One example DC-DC converter topology is a buck converter. The switching slew rate of a buck converter affects efficiency and input supply voltage ringing. For example, a faster switching slew rate is more efficient, but results in more input supply voltage ringing. In some scenarios, input supply voltage ringing can result in an input supply voltage that exceeds the breakdown voltage for at least one switch of a buck converter. Efforts to improve switching converters are ongoing.

SUMMARY

In accordance with at least one example of the disclosure, a system comprises a switching converter with an output inductor. The switching converter also comprises a switch set with a switch node coupled to the output inductor. The switching converter also comprises a first drive stage coupled to the switch set. The switching converter also comprises a second drive stage coupled to the switch set. The switching converter also comprises a controller coupled to the first drive stage and the second drive stage. The controller comprises a supply voltage detector circuit. The controller also comprises a level shifter coupled to an output of the supply voltage detector circuit. The controller also comprises a selection circuit coupled between the level shifter and the second drive stage.

In accordance with at least one example of the disclosure, a switching converter device comprises a switch set with a switch node coupled to an output inductor node. The switching converter device also comprises a first drive stage coupled to the switch set. The switching converter device also comprises a second drive stage coupled to the switch set. The switching converter device also comprises a controller coupled to the first drive stage and the second drive stage. The controller is configured to select between a first drive mode and a second drive mode. The first drive mode enables either the first drive stage or the second drive stage to provide a drive signal to the switch set. The second drive mode enables both of the first drive stage and the second drive stage to provide a drive signal to the switch set.

In accordance with at least one example of the disclosure, a switching converter circuit comprises a first drive stage and a second drive stage. The switching converter circuit also comprises a signal path coupled to the first drive stage and the second drive stage. The signal path is configured to selectively trigger a first drive mode and a second drive mode. Either the first drive stage or the second drive stage is selected to provide a drive signal in the first drive mode. Both the first drive stage and the second drive stage are selected to provide a drive signal in the second drive mode.

BRIEF DESCRIPTION OF THE DRAWINGS

For a detailed description of various examples, reference will now be made to the accompanying drawings in which.

DETAILED DESCRIPTION

Disclosed herein are switching converter topologies with multiple drive stages and drive modes. The drive stages are coupled to a switch set of the switching converter, where the switch set includes at least one switch and a switch node. With the disclosed switching converter topologies, the switching converter adjusts its operations based on the input supply voltage. For example, if the input supply voltage is less than a threshold level, two of two drive stages are used to provide a drive signal to the switch set of a switching converter (e.g., to drive a high-side switch or a low-side switch). When two of two drive stages are used to provide a drive signal to the switch set, the switching slew rate is increased, which increases the efficiency of the switching converter and increases input supply voltage ringing. Because the input supply voltage is less than the threshold level, such ringing will not exceed a maximum voltage target (e.g., a breakdown voltage of at least one transistor of a switching converter). On the other hand, if the input supply voltage is greater than or equal to the threshold level, only one of two drive stages are used to provide a drive signal to the switch set of a switching converter (e.g., to drive a high-side switch or a low-side switch). When only one of two drive stages are used to provide a drive signal to the switch set, the switching slew rate is decreased, which decreases the efficiency of the switching converter and decreases input supply voltage ringing. Because the input supply voltage is greater than or equal to the threshold level, such ringing should be minimized to avoid exceeding a maximum voltage target (e.g., a breakdown voltage of at least one transistor of a switching converter).

In some examples, a switching converter includes a controller that supports multiple modes, where the modes are selected based on the output of an input supply voltage detector. For example, if the output of the input supply voltage detector indicates the input supply voltage for the switching converter is greater than or equal to the threshold level, the controller is configured to select a first drive mode that uses only one of a first drive stage and a second drive stage to provide a drive signal to the switch set. On the other hand, if the output of the input supply voltage detector indicates the input supply voltage for the switching converter is less than the threshold level, the controller is configured to select a second drive mode that uses both of the first drive stage and the second drive stage to provide a drive signal to the switch set. In some examples, the controller includes the supply voltage detector circuit and a level shifter, where the level shifter is coupled between the supply voltage detector circuit and the second drive stage.

In some examples, the first drive stage is configured to provide a first drive signal contribution to the switch set and the second drive stage is configured to provide a second drive signal contribution to the switch set, where the second drive signal contribution is larger than the first drive signal contribution. As desired, the controller may support additional modes (e.g., only the first drive stage is used, only the second drive stage is used, both the first and the second drive stages are used). Also, in some examples, more than two drive stages are possible. With the switching converter topologies described herein, switching converter efficiency and ringing management are performed based on an input supply voltage detector and related thresholds. To provide a better understanding, various switching converter options and current monitor circuit options are described using the figures as follows.

Figure 1:
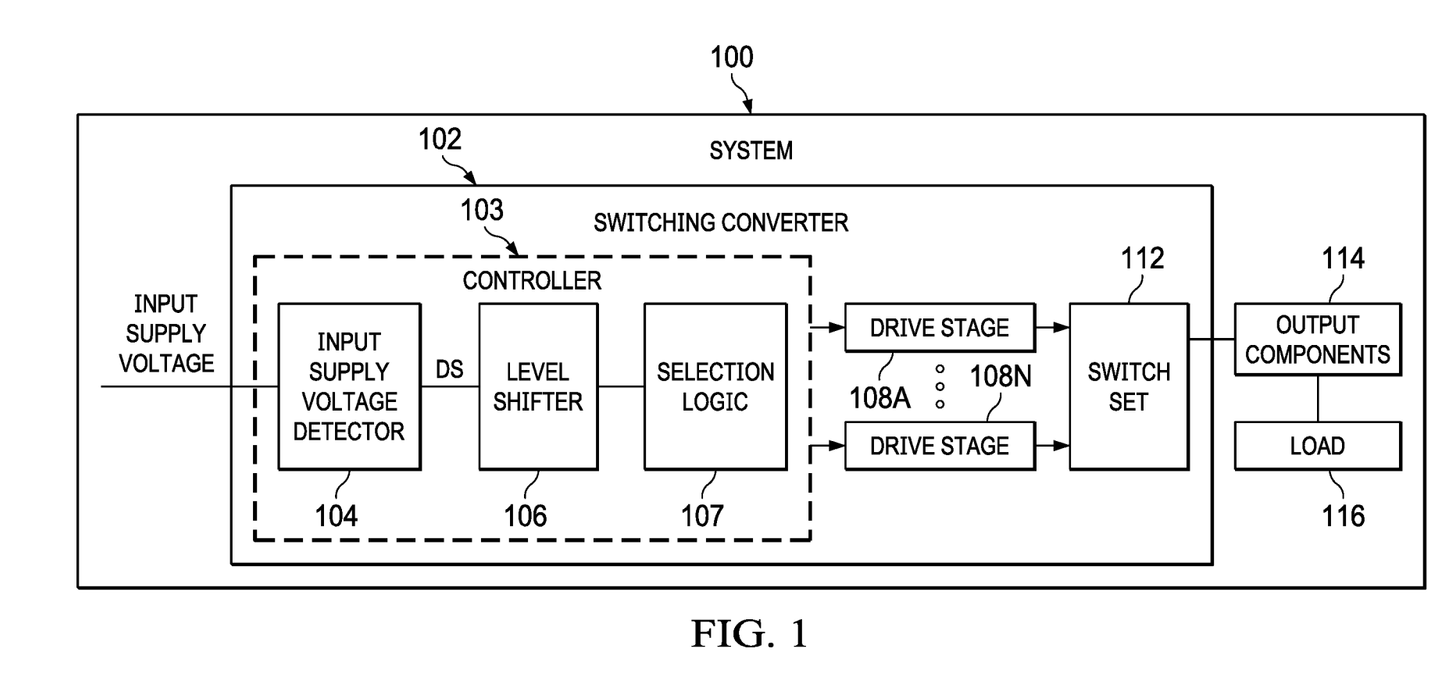
FIG. 1 is a block diagram showing a system in accordance with some examples.

FIG. 1 is a block diagram showing a system 100 in accordance with some examples. The system 100 represents an integrated circuit (IC), a multi-die module (MDM), discrete components, or combinations thereof. In some examples, an IC, MDM, and/or discrete components are coupled together using a printed circuit board (PCB). As shown, the system 100 includes a switching converter device 102 with a plurality of drive stages 108A-108N coupled to a switch set 112. The switch set 112 includes one or more switches and a switch node. In one example, the drive stages 108A-108N are coupled to a high-side switch of the switch set 112, where each of the drive stages 108A-108N is configured to provide a respective drive signal contribution to the high-side switch. In another example, the drive stages 108A-108N are coupled to a low-side switch of the switch set 112, where each of the drive stages 108A-108N is configured to provide a respective drive signal contribution to the high-side switch. In some examples, each drive signal contribution is equal to each other (e.g., 50% contribution for two drive signals, 25% contribution for four drive signals, etc.). In other examples, each drive signal contribution is different from each other (e.g., 60% and 40% contributions for two drive signals, etc.). In some examples, some of the drive stages 108A-108A are coupled to a high-side switch of the switch set 112, while others of the drive stages 108A are coupled to a low-side switch of the switch set 112.

In the example of FIG. 1, the drive stages 108A-108N are coupled to a controller 103. The controller 103 directs the drive stages 108A-108N based on the input supply voltage for the switch converter 102. As shown, the controller 103 includes an input supply voltage detector 104 configured to detect the input supply voltage level. In some examples, the input supply voltage detector 104 uses one or more comparators and thresholds to perform input supply voltage detection. In other examples, the input supply voltage detector 104 is configured to measure the input supply voltage. Regardless of the particular input supply voltage detection mechanism that is used, the input supply voltage detector 104 is configured to provide a detection signal (DS) that indicates the input supply voltage level.

In some examples, the controller 103 also includes a level shifter 106 configured to receive the detection signal from the input supply voltage detector 104. The level shifter 106 adjusts the detection signal to another voltage domain to enable the controller 103 to enable or disable at least one of the drive stages 108A-108N. In the example of FIG. 1, the controller 103 also includes selection logic 107 configured to select one of multiple modes. In some examples, the modes are selected based on the detection signal output from the input supply voltage detector 104. For example, if the detection signal indicates the input supply voltage for the switching converter 102 is greater than or equal to a threshold level, the controller 103 is configured to select a first drive mode that uses only one (or only a subset) of the drive stages 108A-108N to provide a drive signal to the switch set 112. On the other hand, if the detection signal from the input supply voltage detector 104 indicates the input supply voltage for the switching converter 102 is less than the threshold level, the controller 103 is configured to select a second drive mode that uses more (or all) the drive stages 108A-108N (compared to the first drive mode) to provide a drive signal to the switch set.

In one example, there are two drive stages. When the input supply voltage is greater than or equal to a threshold level, the detection signal output from the input supply voltage detector 104 is low. In response, the level shifter 106 is not used and the controller 103 directs a first of the two drive stages to provide a drive signal to the switch set 112. When the input supply voltage is less than the threshold level, the detection signal output from the input supply voltage detector 104 is higher. In response, the level shifter 106 changes the voltage domain of the detection signal, resulting in the controller 103 directing both of the two drive stages to provide a drive signal to the switch set 112.

In a buck converter example, the switch set 112 includes a high-switch switch and a low-side switch coupled in series between an input supply voltage node and a ground node. In this example, a node between the high-side switch and the low-side switch corresponds to a switch node or output inductor node, which is coupled to an output inductor (e.g., one of the output components 114 for the system 100). In this example, the output components 114 also include an output capacitor, where charge stored by the output capacitor is provided to a load 116. In some examples, the controller 103 uses different modes to direct the drive stages 108A-108N to provide a drive signal to a high-side switch based on an input supply voltage level. In other examples, the controller 103 uses different modes to direct the drive stages 108A-108N to provide a drive signal to a low-side switch based on an input supply voltage level. In some examples, a first set of drive stages are used to provide a drive signal to a high-side switch based on an input supply voltage level, and a second set of drive stages are used to provide a drive signal to a low-side switch based on an input supply voltage level.

Figure 2:
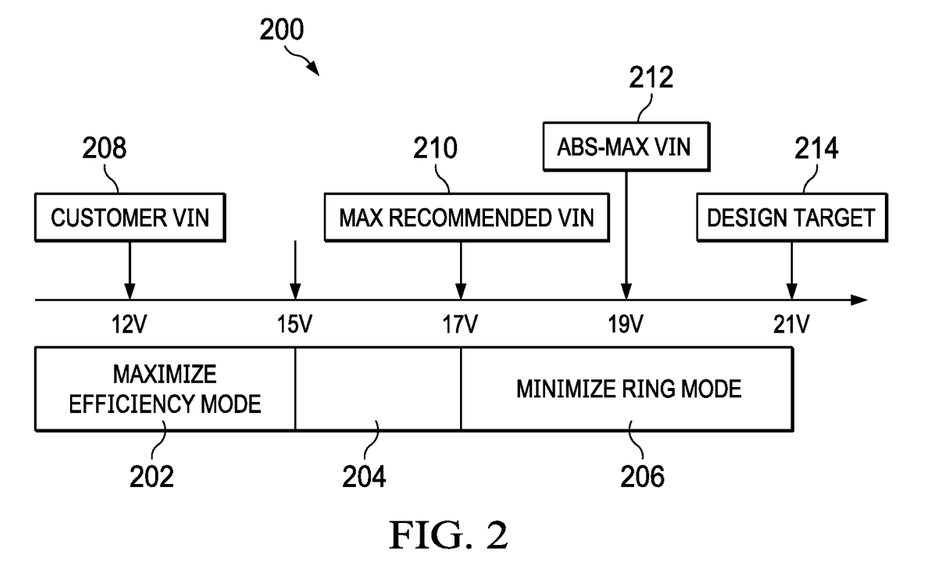
FIG. 2 is a chart showing input supply voltages for a switching converter and related modes in accordance with some examples.

FIG. 2 is a chart 200 showing input supply voltages for a switching converter (e.g., the switching converter 102 in FIG. 1) and related modes in accordance with some examples. As shown, the chart 200 represents a voltage range from approximately 11V to 21V with different modes assigned to different portions of the represented voltage range. More specifically, the different modes include a maximize efficiency mode 202, an intermediate mode 204, and a minimize ring mode 206. In the example of FIG. 2, the maximum efficiency mode 202 corresponds to 11V-15V, the intermediate node 204 corresponds to 15V-17V, and the minimize ring mode 206 corresponds to 17V-21V. Also, example values for a customer input supply voltage 208 (e.g., 12V), a maximum recommended input supply voltage (e.g., 17V) 210, an absolute maximum input supply voltage (e.g., 19V) 212, and a design target input supply voltage (e.g., 21V) 214 are represented. In other examples, the voltages assigned to the maximize efficiency mode 202, the intermediate mode 204, and the minimize ring mode 206 may vary from the example of FIG. 2. Also, the customer input supply voltage 208, the maximum recommended input supply voltage 210, the absolute maximum input supply voltage 212, and the design target input supply voltage 214 may vary.

Figure 3A:
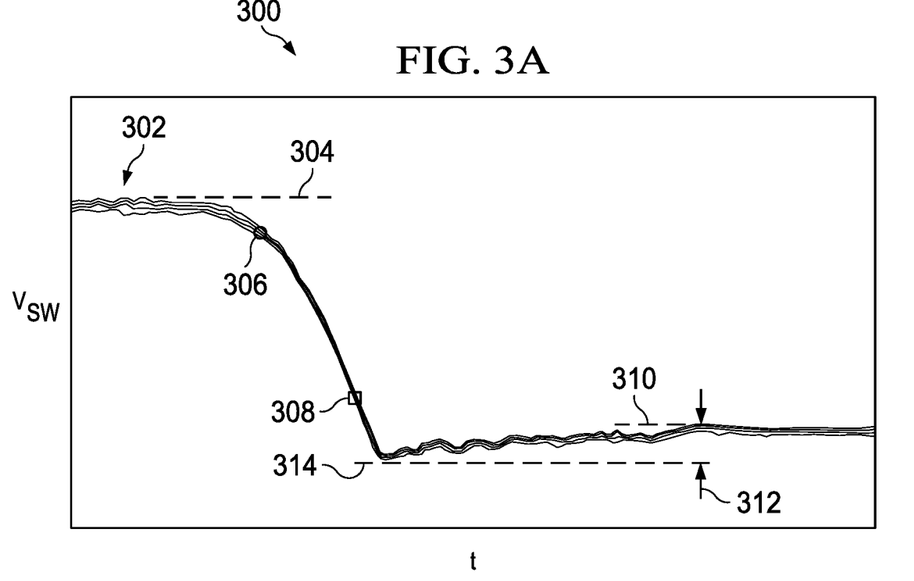
FIGS. 3A and 3B are timing diagrams showing switching node voltage waveforms in accordance with some examples.
Figure 3B:
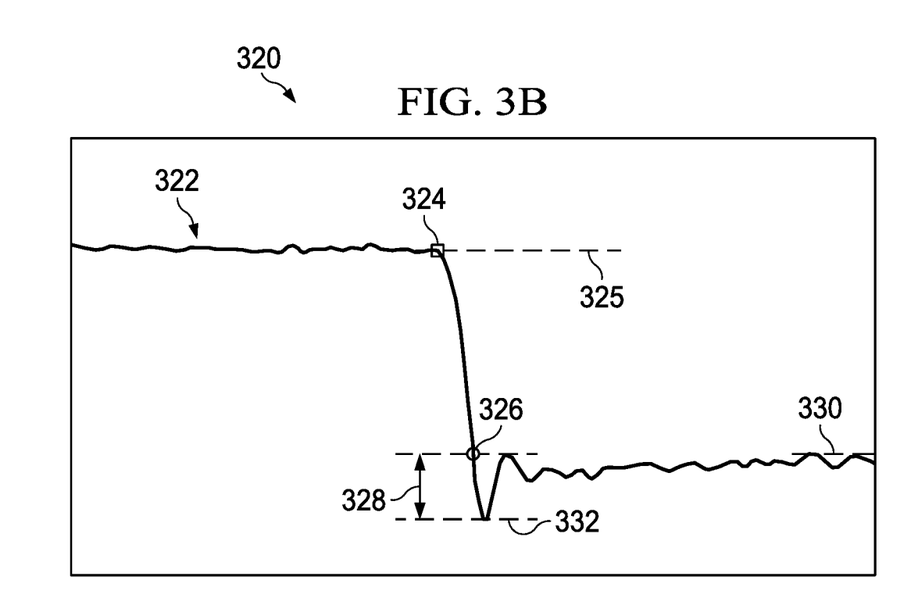

FIGS. 3A and 3B are timing diagrams showing switching node voltage waveforms in accordance with some examples. In the timing diagram 300 of FIG. 3A, a switch node voltage waveform 302 is represented. As shown, the switch node voltage waveform 302 shows a falling edge scenario, where the switch node voltage drops from a high level 304 to a low level 310. In the example of FIG. 3A, the slew rate of the falling edge is measured as the change in voltage/change in time (dv/dt) from points 306 to 308. The switch node voltage waveform 302 also shows that the switch node voltage reaches a minimum value 314 with an offset 312 between the minimum value 314 and the low level 310. In the example of FIG. 3A, the slew rate for the switch node voltage is approximately 3V/ns. Such a slew rate reduces ringing issues, buts results in inefficient switching operations (more switching losses compared to faster slew rates).

In the timing diagram 320 of FIG. 3B, another switch node voltage waveform 322 is represented. As shown, the switch node voltage waveform 322 shows a falling edge scenario, where the switch node voltage drops from a high level 325 to a low level 330. In the example of FIG. 3B, the slew rate of the falling edge is measured as the change in voltage/change in time (dv/dt) from points 324 to 326. The switch node voltage waveform 320 also shows that the switch node voltage reaches a minimum value 332 with an offset 328 between the minimum value 332 and the low level 330. In the example of FIG. 3B, the slew rate for the switch node voltage is approximately 10V/ns. Such a slew rate is more efficient (compared to the slew rate of the switch node voltage waveform 302), but increases ringing issues. In other words, the offset 328 represented in FIG. 3B is larger than the offset 312 represented in FIG. 3A. Depending on the input supply voltage level relative to the breakdown voltage of components used for a switching converter (e.g., the switching converter 102 in FIG. 1), different offsets are permissible (the input supply voltage plus the offset should not extend beyond the breakdown voltage of switching converter components).

Figure 4:
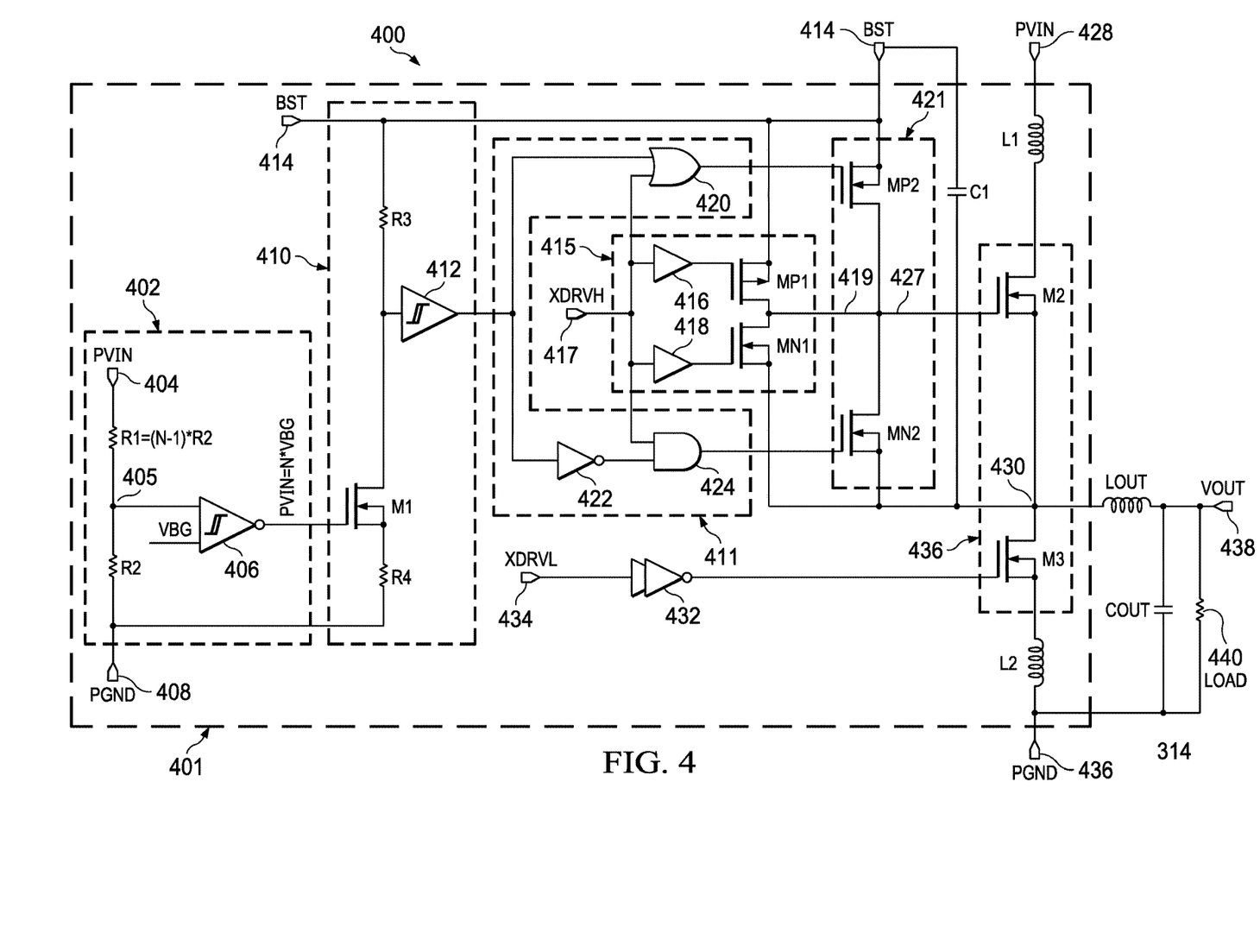
FIG. 4 is a schematic diagram showing a system in accordance with some examples.

FIG. 4 is a schematic diagram showing a system 400 in accordance with some examples. As shown, the system 400 includes a switching converter 401 (an example of the switching converter 102 in FIG. 1) with a switch set 436 (an example of the switch set 112 in FIG. 1), drive stages 415 and 421 (examples of the drive stages 108A-108N in FIG. 1), selection logic 411 (an example of the selection logic 107 in FIG. 1), a level shifter 410 (an example of the level shifter 106 in FIG. 1), and an input supply voltage detector 402 (an example of the input supply voltage detector 104 in FIG. 1).

As shown, the switch set 436 includes a high-side switch (M2) and a low-side switch (M3). Between M2 and M3 is a switch node 430. In the example of FIG. 4, M2 includes a control terminal coupled to a first drive stage 415 and a second drive stage 421. The first current terminal of M2 is coupled to an input supply node 428 via a first inductor (L1), and the second current terminal of M2 and the first current terminal of M3 are coupled to the switch node 430. Also, the control terminal of M3 is coupled to a low-side drive signal (XDRVL) node 434 via buffers 432. The second current terminal of M3 is coupled to a ground node 436 via a second inductor (L2). In the example of FIGS. 4, L1 and L2 represent parasitic inductance (e.g., from a printed circuit board or "PCB"), which is a consideration for driver design.

As shown, the switch node 430 is also coupled to a first end of an output inductor (LOUT). The second end of LOUT is coupled to an output node 438. As shown, the output node 438 is also coupled to a first terminal of an output capacitor (COUT). The second terminal of COUT is coupled to the ground node 436. In the example of FIG. 4, a load 440 is coupled between the output node 438 and the ground node 436, where the load 440 is powered by the output voltage (VOUT) at the output node 438. Comparing FIGS. 1 and 4, LOUT and COUT in FIG. 4 are examples of the output components 114, and the load 440 in FIG. 4 is an example of the load 116 in FIG. 1.

In operation, the first drive stage 415 is configured to provide a first drive signal 419 to the control terminal of M2 (the high-side switch) in response to a high-side drive signal (XDRVH) from node 417. More specifically, the first drive stage 415 includes two transistors, MP1 and MN1, having their control terminals coupled to the node 417 via respective buffers 416 and 418. Also, the first current terminal of MP1 is coupled to an input supply (BST) node 414. In some examples, BST is a power supply which is about 5V higher than the switching node 430. In one example, the voltage level for BST is obtained by placing a capacitor (C1) between the BST node 414 and the switch node 430. More specifically, a first (e.g., top) plate of C1 is coupled to the BST node 414 and a second (e.g., bottom) plate of C1 is coupled to the switch node 430.

The second current terminal of MP1 is coupled to the first current terminal of MN1, and the second current terminal of MN1 is coupled to the switch node 430. In response to VOUT dropping below a threshold or another trigger, XDRVH transitions from high-to-low, which causes MP1 and MN1 to provide the first drive signal 419 to turn M2 on (increasing VOUT). Once VOUT reaches a threshold value or another trigger, XDRVH transitions from low-to-high, which causes MP1 and MN1 to stop providing the first drive signal 419, which results in M2 being turned off. In some examples, the first drive stage 415 is used in multiple drive modes.

In operation, the second drive stage 421 is configured to provide a second drive signal 427 to the control terminal of M2 (the high-side switch) in response to an indication from the input supply voltage detector 402 that the input supply voltage is less than a threshold value. More specifically, the input supply voltage detector 402 includes a voltage divider with R1 and R2 in series between an input voltage supply (PVIN) node 404 and a ground (PGND) node 408. The value at the node 405 between R1 and R2 is provided to one of the input nodes of a comparator 406. The other input node of the comparator 406 receives a reference voltage (VBG). In some examples, PVIN=N*VGB and R1=(N−1)*R2. When the voltage at node 405 is greater than or equal to VBG, the output of the comparator 406 is low (when VIN is high, the output of the comparator 406 is high), resulting in the second drive stage 421 not being used when XDRVH is low (e.g., only the first drive stage 415 is used when the input supply voltage is greater than a threshold). On the other hand, when the voltage at node 405 is less than VBG, the output of the comparator 406 is low, resulting in the second drive stage 421 being used when XDRVH is low (XDRVH high results in M2 being turned off and XDRVH low results in M2 being turned on) (e.g., both the first drive stage 415 and the second drive stage 421 are used when the input supply voltage is less than a threshold).

As shown, the output of the comparator 406 provides a control signal to the level shifter 410, which includes R3, M1, and R4 between a BST node 414 and the ground node 408. Also, the control terminal of M1 is coupled to the output of the comparator 406, the first current terminal of M1 is coupled to R3, and the second current terminal of M1 is coupled to R4. More specifically, a first end of R3 is coupled to the BST node 414 and a second end of R3 is coupled to the first current terminal of M1. Meanwhile, the first end of R4 is coupled to the second current terminal of M1, while the second end of R4 is coupled to the ground node 408. In the example of FIG. 4, component 412 (e.g., a Schmitt comparator) adjusts the voltage level at the second end of R3 to another voltage level.

As shown, the output of the component 412 is provided to selection logic 411. In the example of FIG. 4, the selection logic 411 includes an OR gate 420, an inverter 422, and a AND gate 424. More specifically, the output of the component 412 is provided to an input node of the OR gate 420, where the output node of the OR gate is coupled to the control terminal of MP2. The other input node of the OR gate 420 is coupled to the high-side drive signal node 417. The output of the component 412 is also an input to the inverter 422. The output of the inverter 422 is coupled to an input node of the AND gate 424. The other input node of the AND gate 424 is coupled to the high-side drive signal node 417. The output node of the AND gate 424 is coupled to the control terminal of MN2. In the first drive mode, only the first drive state 415 is used. In some examples, the control of MP1 and MN1 in the first drive mode is a function of XDRVH. More specifically, when XDRVH is low in the first drive mode, MN1 turns off, MP1 turns on, and M2 is turned on. In contrast, when XDRVH is high in the first drive mode, MN1 turns on, MP1 turns off, M2 is turned off. In the second drive mode, both the first drive stage 415 and the second drive stage 421 are used. In some examples, the control of MP1, MN1, MP2, and MN2 in the second drive mode is a function of XDRVH. More specifically, when XDRVH is low in the second drive mode, MP1 and M2 are turned on. If the output of component 412 is low (indicating VIN is lower than a threshold), MP2 will also turn on (causing M2 to turn on faster). On the other hand, if the output of component 412 is high (indicating VIN is higher than the threshold), MP2 will not be turned on. Also, when XDRVH is high in the second drive mode, MN1 is turned on, and M2 is turned off. If the output of component 412 is low (indicating VIN is lower than the threshold), MN2 will also turn on (causing M2 turn off faster). In contrast, if the output of component 412 is high (indicating VIN is higher than the threshold), MN2 will not turn on.

In the example of FIG. 4, the operations of the switching converter 401 are adjusted based on the input supply voltage. If the input supply voltage is less than a threshold level (detected by the input supply voltage detector 402), both of the first and second drive stages 415 and 421 are used to provide a drive signal to M2. When both of the first and second drive stages 415 and 421 are used to provide a drive signal to M2, the switching slew rate is increased, which increases the efficiency of the switching converter 401 and increases input supply voltage ringing. Because the input supply voltage is less than the threshold level, such ringing will not exceed a maximum voltage target (e.g., a breakdown voltage of at least one transistor of the switching converter 401). On the other hand, if the input supply voltage is greater than or equal to the threshold level, only the first drive stage 415 is used to provide a drive signal to M2. When only the first drive stage 415 is used to provide a drive signal to M2, the switching slew rate is decreased, which decreases the efficiency of the switching converter 401 and also decreases input supply voltage ringing. Because the input supply voltage is greater than or equal to the threshold level, such ringing should be minimized to avoid exceeding a maximum voltage target (e.g., a breakdown voltage of at least one transistor of the switching converter 401).

In some examples, the input supply voltage detector 402, the level shifter 410, and the selection logic 411 of FIG. 4 are an example of a signal path coupled to the first drive stage 415 and the second drive stage 421, where the signal path is configured to selectively trigger a first drive mode and a second drive mode. In the first drive mode, either the first drive stage or the second drive stage is selected to provide a drive signal (e.g., to M2 in FIG. 4). In the second drive mode, both the first drive stage and the second drive stage are selected to provide a drive signal (e.g., to M2).

Figure 5A:
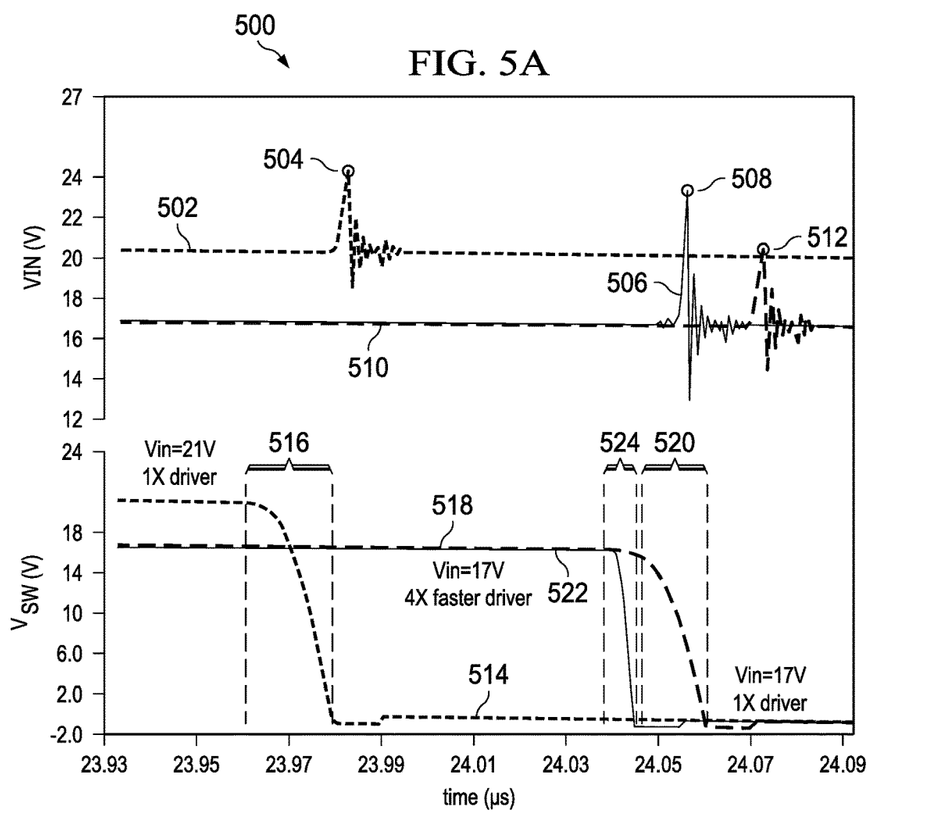
FIG. 5A is a timing diagram showing input supply voltage waveforms and switching node voltage waveforms in accordance with some examples.

FIG. 5A is a timing diagram 500 showing input supply voltage waveforms and switching node voltage waveforms in accordance with some examples. In the timing diagram 500, various input supply voltage waveforms 502, 506, and 510 are represented. The input supply voltage waveform 502 has a base value of around 21V and a maximum value of around 25V at time 504 due to ringing. The input supply voltage waveform 506 has a base value of around 17V and a maximum value of around 24V at time 508 due to ringing. The input supply voltage waveform 510 has a base value of around 17V and a maximum value of around 21V at time 512 due to ringing.

In the timing diagram 500, various switch node voltage waveforms 514, 518, 522 are also represented. The switch node voltage waveform 514 corresponds to the input supply voltage waveform 502. As shown, the switch node voltage for the switch node voltage waveform 514 starts at around 21V before being reduced to approximately 0V, where the transition from 21V to 0V mostly occurs during a falling edge interval 516 corresponding to the ringing in the input supply voltage waveform 502. The switch node voltage waveform 518 corresponds to the input supply voltage waveform 510. As shown, the switch node voltage for the switch node voltage waveform 518 starts at around 17V before being reduced to approximately 0V, where the transition from 17V to 0V mostly occurs during a falling edge interval 520 corresponding to the ringing in the input supply voltage waveform 510.

The switch node voltage waveform 522 corresponds to the input supply voltage waveform 506. As shown, the switch node voltage for the switch node voltage waveform 522 starts at around 17V before being reduced to approximately 0V, where the transition from 17V to 0V mostly occurs during a falling edge interval 524 corresponding to the ringing in the input supply voltage waveform 506. As shown, the falling edge interval 524 is smaller than the falling edge intervals 516 and 520, which indicates that the slew rate and related efficiency for the switch node voltage waveform 522 is higher than the respective slew rates of the switch node voltage waveforms 514 and 518. In the timing diagram 500, the input supply voltage waveform 506 and the switch node voltage waveform 522 represent a scenario where the input supply voltage is determined to be less than a threshold level. In response, multiple drive stages are used to drive a switching converter switch to increase efficiency when there is a voltage budget available for ringing as described herein.

Figure 5B:
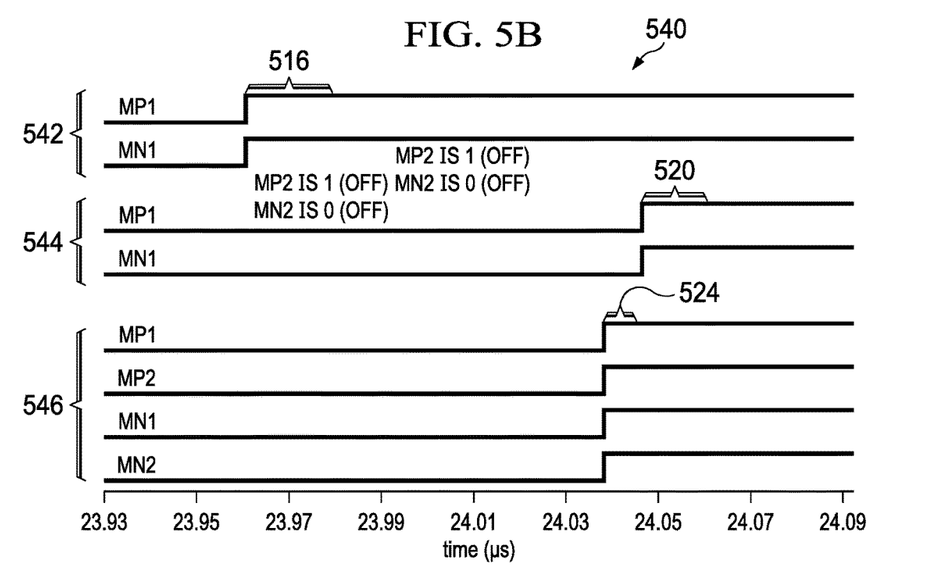
FIG. 5B is a timing diagram showing drive stage control signals corresponding to various waveform represented in FIG. 5A in accordance with some examples.

FIG. 5B is a timing diagram 540 showing drive stage control signals corresponding to various waveform represented in FIG. 5A in accordance with some examples. As shown, the timing diagram 540 includes a set of waveforms 542 corresponding to the on/off state of MP1 and MN1, where the set of waveforms 542 results in the falling edge interval 516 represented in FIG. 5A. The timing diagram 540 also includes a set of waveforms 544 corresponding to on/off states for MP1 and MN1, where the set of waveforms 544 results in the falling edge interval 520 represented in FIG. 5A. In some examples, the control signals for MP2 and MN2 are is an off state during the falling edge intervals 516 and 520. The timing diagram 540 also includes a set of waveforms 546 corresponding to the on/off states for MP1, MP2, MN1, and MN2, where the set of waveforms 546 results in the falling edge interval 524 represented in FIG. 5A.

Figure 6A:
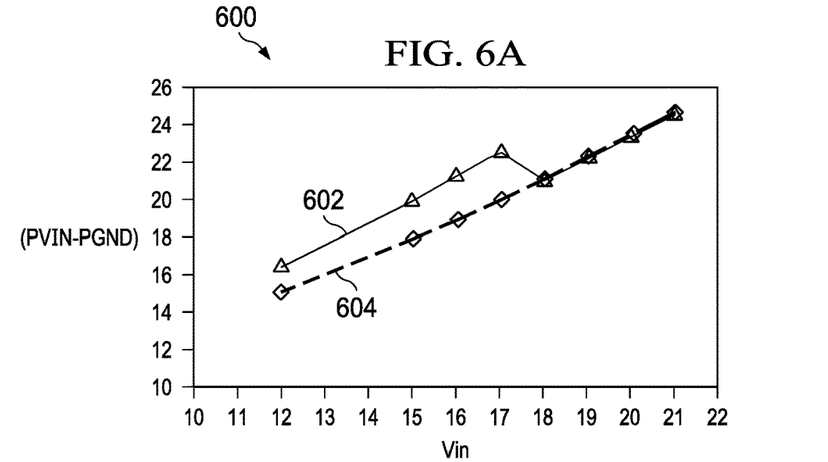
FIGS. 6A and 6B are charts showing maximum differential voltage values as a function of input supply voltages in accordance with some examples.
Figure 6B:
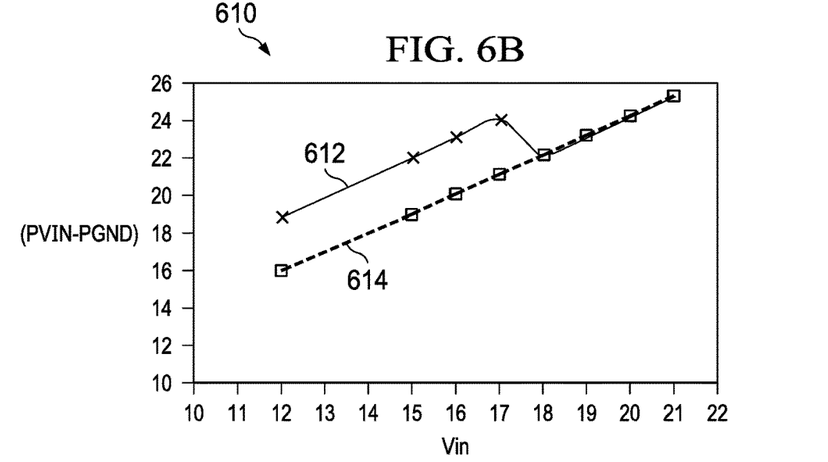

FIGS. 6A and 6B are charts 600 and 610 showing maximum differential voltage values as a function of input supply voltages in accordance with some examples. In the chart 600 of FIG. 6A, line 604 corresponds to a previous drive strategy, where PVIN-PGND increases linearly as VIN increases. As used herein, PVIN and PGND include the ringing on this node (PVIN−PGND=VIN (dc)+VIN (ringing)+GND (ringing)). Meanwhile, line 602 in the chart 600 corresponds to a new drive strategy, where PVIN-PGND for line 602 is higher than PVIN-PGND for line 604. As shown, line 602 increases linearly as VIN increases up to a predetermined threshold VIN (e.g., 17V in the example of FIG. 6A). Above the threshold VIN, line 602 dips lower such that PVIN-PGND for the line 602 matches PVIN-PGND for the line 604 at VIN values of 18V or more. In the example of FIG. 6A, line 602 corresponds to a 2x value, which indicates the second stage driver is equal in strength to the first stage driver. In some examples, equal strength refers to having the same channel width, such that when both stage drivers are on, the channel width is doubled, Thus, when VIN is below the threshold, both the first and second stage drivers turn on, resulting in the line 602 being a 2x value relative to the line 604.

In the chart 610 of FIG. 6B, line 614 corresponds to a previous drive strategy, where PVIN-PGND increases linearly as VIN increases. Meanwhile, line 612 in the chart 610 corresponds to a new drive strategy, where PVIN-PGND for line 614 is higher than PVIN-PGND for line 614. As shown, line 612 increases linearly as VIN increases up to a predetermined threshold VIN (e.g., 17V in the example of FIG. 6B). Above the threshold VIN, line 612 dips lower such that PVIN-PGND for the line 612 matches PVIN-PGND for the line 614 at VIN valued of 18V or more. In the example of FIG. 6B, line 612 corresponds to a 4x value, which indicates the second stage driver is 3 times the strength to the first stage driver. Thus, when VIN is below the threshold, both the first and second stage drivers turn on, resulting in the line 612 being a 4x value relative to the line 614.

Figure 6C:
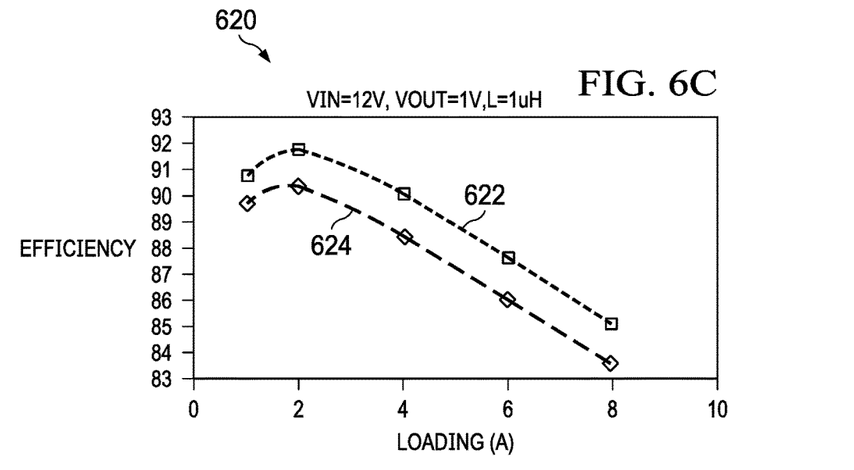
FIG. 6C is a chart showing efficiency as a function of loading in accordance with some examples.

FIG. 6C is a chart 620 showing efficiency as a function of loading in accordance with some examples. In chart 620, line 624 corresponds to an existing drive strategy, where efficiency reaches around 90% before dropping as a function of loading to around 84%. Meanwhile, line 622 corresponds to a new drive strategy, where efficiency reaches around 92% before dropping as a function of loading to around 85%. For the chart 620, assumed values includes VIN=12V, VOUT=1V, and L=1 pH.

Figure 7:
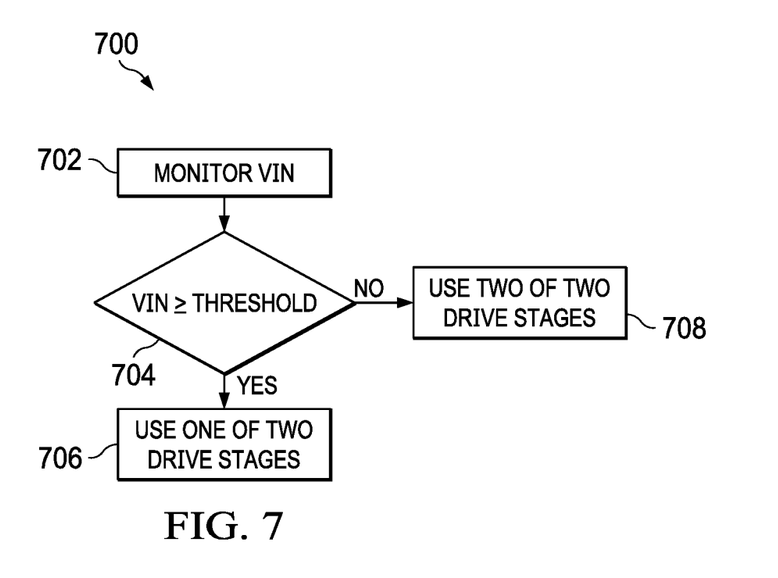
FIG. 7 is a flowchart showing a switching converter control method in accordance with some examples.

FIG. 7 is a flowchart showing a switching converter control method 700 in accordance with some examples. As shown, the method 700 includes monitoring VIN at block 702. If VIN is greater than or equal to a threshold level (determination block 704), one of two drive stages (e.g., the first drive stage 415 in FIG. 4) is used to provide a drive signal at block 706. On the other hand, if VIN is not greater than or equal to the threshold level (determination block 704), two of two drive stages (e.g., the first and second drive stages 415 and 421 in FIG. 4) are used to provide a drive signal at block 706. In some examples, the method 700 is used to control the high-side switch of a switching converter (as in the example switch converter 401 of FIG. 4). In other examples, the method 700 is used to control the low-side switch of a switching converter.

In some examples, one or more of the disclosed switching converters (e.g., the switching converter 102 of FIG. 1, or the switching converter 401 of FIG. 4) is used in a battery-operated device, such as a laptop or tablet. As an example, a switching converter may be used in a battery-operated device, where VIN for the switching converter is provided by the battery or an AC/DC adapter. The switching converter reduces VIN to VOUT (e.g., a VIN of 6V or more, and a VOUT of 3.3V or 5V) for use in powering electronic components of the battery-operated device.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:
1. A system, comprising:
a switching converter with:
a switch set including a high-side switch, a low-side switch and a switch node connected between the high-side switch and the low-side switch;
a first drive stage including a first transistor and a second transistor, the first transistor having a first control terminal, a first current terminal and a second current terminal coupled to the switch set, the second transistor having a second control terminal, a third current terminal directly connected to the switch node and a fourth current terminal directly connected to the second current terminal and the switch set;
a second drive stage including a third transistor and a fourth transistor, the third transistor having a third control terminal, a fifth current terminal and a sixth current terminal directly connected to the second current terminal and the switch set, the fourth transistor having a fourth current terminal, a seventh current terminal directly connected to the switch node and an eighth current terminal coupled to the second current terminal and the switch set; and a controller coupled to the second drive stage, wherein the controller comprises:
- a supply voltage detector circuit;
- a level shifter coupled to an output of the supply voltage detector circuit; and
- a selection circuit coupled between the level shifter and the second drive stage.

2. The system of claim 1, wherein the first drive stage is configured to provide a first drive signal contribution to the switch set and the second drive stage is configured to provide a second drive signal contribution to the switch set, wherein the second drive signal contribution is larger than the first drive signal contribution.

3. The system of claim 2, wherein the controller is configured to select one of:
- a first drive mode that enables only the first drive stage; and
- a second drive mode that enables both the first and second drive stages.

4. The system of claim 2, wherein the controller is configured to select the first drive mode in response to the supply voltage detector circuit detecting that a supply voltage for the switching converter is greater than a threshold.

5. The system of claim 2, wherein the controller is configured to select the second drive mode in response to the supply voltage detector circuit detecting that a supply voltage for the switching converter is less than a threshold.

6. The system of claim 2, wherein the controller is configured to select a third drive mode that enables only the second drive stage.

7. A switching converter device, comprising:
- a switch set with a high-side transistor, a low-side transistor and a switch node connected between the high-side transistor and the low-side transistor;
- a first drive stage including a first transistor and a second transistor, the first transistor having a first control terminal, a first current terminal and a second current terminal coupled to the switch set, the second transistor having a second control terminal, a third current terminal directly connected to the switch node and a fourth current terminal directly connected to the second current terminal and the switch set;
- a second drive stage including a third transistor and a fourth transistor, the third transistor having a third control terminal, a fifth current terminal and a sixth current terminal coupled to the second current terminal and the switch set, the fourth transistor having a fourth current terminal, a seventh current terminal directly connected to the switch node and an eighth current terminal directly connected to the second current terminal and the switch set; and
- a controller coupled to the first drive stage and the second drive stage, wherein the controller is configured to select between a first drive mode and a second drive mode, where the first drive mode enables either the first drive stage or the second drive stage to provide a drive signal to the switch set, and wherein the second drive mode enables both of the first drive stage and the second drive stage to provide the drive signal to the switch set.

8. The switching converter device of claim 7, wherein the first drive stage is configured to provide a first drive signal contribution to the switch set and the second drive stage is configured to provide a second drive signal contribution to the switch set, wherein the second drive signal contribution is larger than the first drive signal contribution.

9. The switching converter device of claim 8, wherein the first drive mode enables only the first drive stage, and wherein the controller is configured to support a third drive mode that enables only the second drive stage.

10. The switching converter device of claim 7, wherein the controller comprises a supply voltage detector circuit and is configured to enable the first drive mode in response to the supply voltage detector circuit detecting that a supply voltage for the switching converter is greater than a threshold.

11. The switching converter device of claim 7, wherein the controller comprises a supply voltage detector circuit and is configured to enable the second drive mode in response to the supply voltage detector circuit detecting that a supply voltage for the switching converter is less than a threshold.

12. The switching converter device of claim 7, wherein the controller comprises a supply voltage detector circuit and a level shifter, wherein the level shifter is coupled between the supply voltage detector circuit and the second drive stage.

13. A driver circuit for providing driver signals to a switch set of a switching converter, the switch set including a high-side switch and a low-side switch and the driver circuit comprising:
- an input supply voltage detector having an input adapted to be coupled to an input voltage supply, the input supply voltage detector having an output;
- a selector circuit having an input, an output, a first logic gate and a second logic gate, the input of the selector circuit coupled to the output of the input supply voltage detector, the output of the selector circuit coupled to an output of the first and second logic gates, and the first logic gate and the second logic gate each having an input coupled to a drive signal;
- a first drive stage including:
  - a first transistor having a first control terminal, a first current terminal and a second current terminal, the first control terminal coupled to the drive signal and the second current terminal coupled to the switch set; and
  - a second transistor having a second control terminal, a third current terminal and a fourth current terminal, the second control terminal coupled to the drive signal, the third current terminal coupled to the second current terminal and the fourth current terminal coupled to the switch set; and
- a second drive stage including:
  - a third transistor having a third control terminal, a fifth current terminal and a sixth current terminal, the third control terminal coupled to the output of the first logic gate, the sixth current terminal directly connected to the second current terminal and the switch set; and
  - a fourth transistor having a fourth control terminal, a seventh current terminal and an eighth current terminal, the fourth control terminal coupled to the output of the second logic gate, the eighth current terminal coupled to the switch set and the seventh current terminal directly connected to the sixth current terminal, the second current terminal and the switch set.

* * * * *